(12) United States Patent
Buescher et al.

(10) Patent No.: US 8,848,770 B2
(45) Date of Patent: Sep. 30, 2014

(54) AUTOMATIC GAIN CONTROL UNIT FOR A LOW POWER RECEIVER OR TRANSCEIVER

(71) Applicant: EM Microelectronic-Marin S.A., Marin (CH)

(72) Inventors: Kevin Scott Buescher, Colorado Springs, CO (US); James Harold Lauffenburger, Colorado Springs, CO (US); Marc Morin, Colorado Springs, CO (US)

(73) Assignee: EM Microelectronic-Marin S.A., Marin (CH)

( * ) Notice: Subject to any disclaimer, the term of this patent is extended or adjusted under 35 U.S.C. 154(b) by 10 days.

(21) Appl. No.: 13/716,657

(22) Filed: Dec. 17, 2012

(65) Prior Publication Data
US 2014/0169417 A1 Jun. 19, 2014

(51) Int. Cl.
*H04B 1/38* (2006.01)
(52) U.S. Cl.
CPC .................................. *H04B 1/3883* (2013.01)
USPC ...... 375/219; 342/92; 359/341.41; 455/234.2
(58) Field of Classification Search
None
See application file for complete search history.

(56) References Cited

U.S. PATENT DOCUMENTS

| | | | | |
|---|---|---|---|---|
| 6,418,303 | B1* | 7/2002 | Blackburn et al. | 455/234.2 |
| 2007/0237273 | A1* | 10/2007 | Tan et al. | 375/350 |
| 2008/0129378 | A1* | 6/2008 | Park et al. | 330/140 |

* cited by examiner

Primary Examiner — Adolf Dsouza
(74) Attorney, Agent, or Firm — Oblon, Spivak, McClelland, Maier & Neustadt, L.L.P.

(57) ABSTRACT

The automatic gain control unit for a radiofrequency receiver includes a first current source for charging a storage capacitor by a first current, four comparators for comparing on the lower side an in-phase positive intermediate signal, an in-phase negative intermediate signal, a quarter-phase positive intermediate signal, a quarter-phase intermediate signal with a first reference threshold to a high amplitude level of the intermediate signals. Each comparator controls a MOS transistor connected in series between a second current source and the storage capacitor in order to discharge the storage capacitor when each transistor is in a conductive state. A bi-stable trigger element is connected to the storage capacitor and to provide an AGC signal depending on the voltage level on the storage capacitor for attenuating or not the gain of the low noise amplifier or of a mixer unit amplifier of the receiver.

16 Claims, 4 Drawing Sheets

AUTOMATIC GAIN CONTROL UNIT FOR A LOW POWER RECEIVER OR TRANSCEIVER

FIELD OF THE INVENTION

The present invention relates to an automatic gain control unit for a low power receiver or transceiver. The automatic gain control unit can be used for a lower power FSK or PSK radiofrequency signal receiver or transceiver. The receiver or transceiver comprises in particular an antenna for receiving radio frequency signals, a low noise amplifier for amplifying and filtering the signals received by the antenna, a local oscillator for supplying oscillating signals, and a mixer unit for mixing the amplified incoming signals with the oscillating signals supplied by the local oscillator, in order to produce alternative intermediate signals. At least one alternative intermediate signal is processed in the automatic gain control unit.

BACKGROUND OF THE INVENTION

For the reception of radiofrequency signals, a receiver includes an automatic gain control unit, which can be used for attenuating or decreasing the gain of at least a low-noise amplifier in presence of large input signals. The automatic gain control unit can also be used for increasing the gain in case of low incoming signals. Usually to tune the gain of a LNA amplifier, a peak detector is used in the automatic gain control loop in order to determine the signal peak level, which allows adjusting the gain of the amplifier. As a function of a comparison between a rectified voltage supplied by the peak detector and a reference signal, the automatic gain control unit can provide an AGC output signal in order to attenuate or not the LNA amplifier. The conventional automatic gain control loop with a peak detector provides low gain and require a lot of current to minimise offsets and maximize bandwidth, which is a drawback.

SUMMARY OF THE INVENTION

It is thus a main object of the invention to provide an automatic gain control unit for a low power receiver or transceiver which overcomes the drawbacks of the prior art in order to control easily said receiver or transceiver to meet stringent sensitivity and inter-modulation, while maintaining a low power consumption.

The invention therefore concerns an automatic gain control unit for a low power receiver or transceiver, said receiver or transceiver comprising:
  at least one antenna for receiving radio frequency signals,
  at least one low noise amplifier for amplifying the signals received by the antenna,
  a local oscillator for supplying oscillating signals,
  at least one mixer unit for mixing the amplified incoming signals with the oscillating signals supplied by the local oscillator, in order to produce alternative intermediate signals,
  wherein the automatic gain control unit includes:
  a first current source for charging or discharging by a first current at least one storage capacitor,
  at least one comparator for comparing at least a first alternative intermediate signal among the alternative intermediate signals and a first reference threshold, which is defined for a comparison with an upper side or a lower side of the first alternative intermediate signal to determine an amplitude level of the first alternative intermediate signal,
  a gate controlled transistor by an output of the comparator, the transistor being conductive when the first alternative intermediate signal is greater than the first reference threshold for a comparison on the upper side, or lower than the first reference threshold for a comparison on the lower side, the transistor being connected in series between a second current source and the storage capacitor in order to discharge or charge by a second current the storage capacitor inversely to the first current, the second current being supplied to the storage capacitor when the transistor is conductive, and the second current having a value greater than the first current, and
  a bi-stable trigger element connected to the storage capacitor and to provide an AGC signal depending on the voltage level on the storage capacitor for tuning the gain of the low noise amplifier or of a mixer unit amplifier.

Some particular embodiments of the automatic gain control unit are defined in the dependent claims 2 to 16.

One advantage of the automatic gain control unit of the present invention lies in the fact that very low input power RF signals can be used to control said control unit. The radiofrequency signals can produce a peak-detected voltage on the order of the offsets of a peak detector, a digital-analogue converter and comparators. This allows the automatic gain control to be used to control a receiver in particular to meet both stringent sensitivity specifications and inter-modulation specifications, while maintaining low power consumption.

Advantageously the automatic gain control unit includes one comparator to compare at least a first alternative intermediate signal with a first reference threshold to determine the high amplitude level on the lower side or the upper side of the alternative intermediate signal. Preferably, four comparators can be used to compare an in-phase positive intermediate signal, an in-phase negative intermediate signal, a quarter-phase positive intermediate signal and a quarter-phase negative intermediate signal, with the first reference threshold. Each comparator controls a MOS transistor at output, which is connected in series with a second current source in order to discharge for example with the second current a storage capacitor, when the MOS transistor is in a conductive state. Said storage capacitor is charged with a first current from a first current source. Depending on the voltage level on the storage capacitor, an AGC output signal is supplied for an amplifier in order to attenuate or not the gain of said amplifier. With the use of four comparators, this allows reducing the mismatch of each comparator and to have a better signal/noise level with respect to only one comparator.

BRIEF DESCRIPTION OF THE DRAWINGS

Other aspects, features and advantages of the present invention will be apparent upon reading the following detailed description of non-limiting example and embodiment made with reference to the accompanying drawings, in which.

DETAILED DESCRIPTION OF THE INVENTION

The following description concerns specifically an automatic gain control unit for a receiver or transceiver, which can pick-up radiofrequency signals, such as FSK or PSK radiofrequency signals. As several parts of a FSK radiofrequency signal receiver, which includes the automatic gain control unit, are well known in this technical field, they will be described not in detail.

Figure 1:
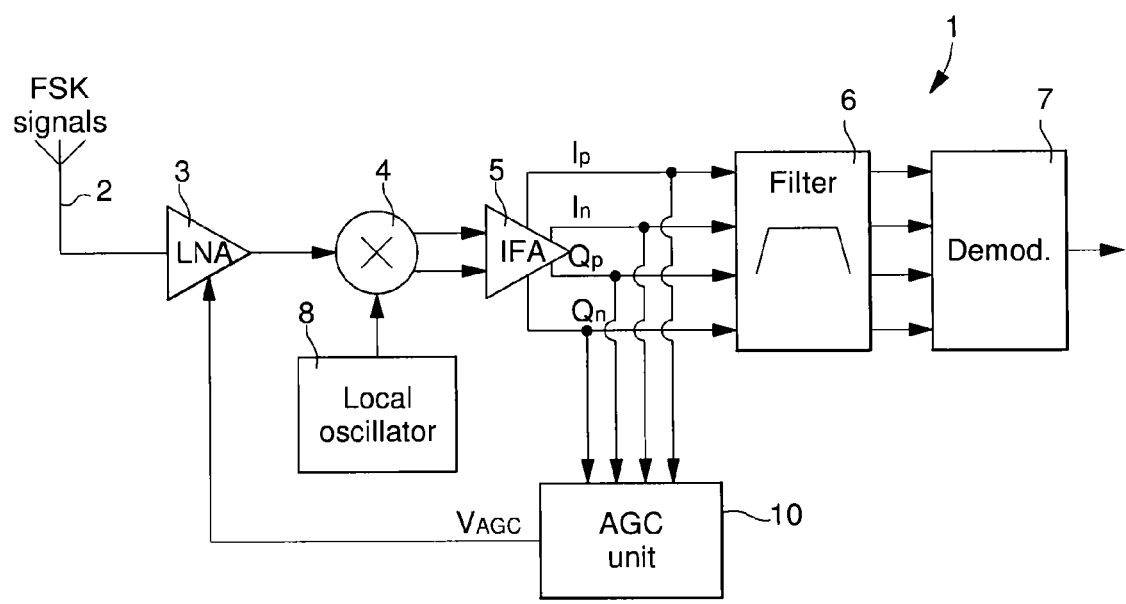
FIG. 1 shows a simplified view of a FSK or PSK radiofrequency signal receiver or transceiver including an automatic gain control unit of the present invention.

FIG. 1 shows some parts of a low power radiofrequency signal receiver or transceiver 1. In particular, it concerns a low power FSK or PSK radiofrequency signal receiver 1. The receiver includes an antenna 2 for receiving FSK or PSK radio frequency signals, at least one low noise amplifier 3 for amplifying and filtering the signals received by the antenna. The receiver further includes a local oscillator 8 for supplying oscillating signals, at least one mixer unit 4 for mixing the amplified incoming signals with the oscillating signals supplied by the local oscillator to produce alternative intermediate signals.

At the output of the mixer unit 4, it can be provided also a mixer amplifier 5, which can produce at output alternative intermediate signals Ip, In, Qp, Qn. The alternative intermediate signals are composed of an in-phase positive intermediate signal Ip, an in-phase negative intermediate signal In, a quarter-phase positive intermediate signal Qp and a quarter-phase negative intermediate signal Qn. Each alternative intermediate signal are phase-shifted of 90° from each other. Said four alternative intermediate signals are based on an in-phase intermediate signal and a quarter-phase intermediate signal supplied at output of the mixer unit 4. The four alternative intermediate signals Ip, In, Qp, Qn are further filtered in a pass-band filter 6 before being supplied to a data demodulator 7.

The four alternative intermediate signals Ip, In, Qp, Qn are supplied at input of an automatic gain control unit 10, which is used to tune the gain of the low noise amplifier 3. However it can be envisaged also to tune the gain of the IFA amplifier 5 at output of the mixer unit 4. When the amplitude level of the alternative intermediate signals Ip, In, Qp, Qn is too high, the automatic gain control unit 10 supplies an AGC output signal $V_{AGC}$ for the LNA amplifier 3 in order to attenuate the gain of said LNA amplifier. If the amplitude level of alternative intermediate signals Ip, In, Qp, Qn is too low, the gain is adapted without attenuation, but can be considered as an increased gain relative to the step with attenuation. Normally said automatic gain control unit 10 is configured for supplying an AGC output signal $V_{AGC}$ with two levels for attenuating or not the gain of the LNA amplifier 3.

Figure 2:
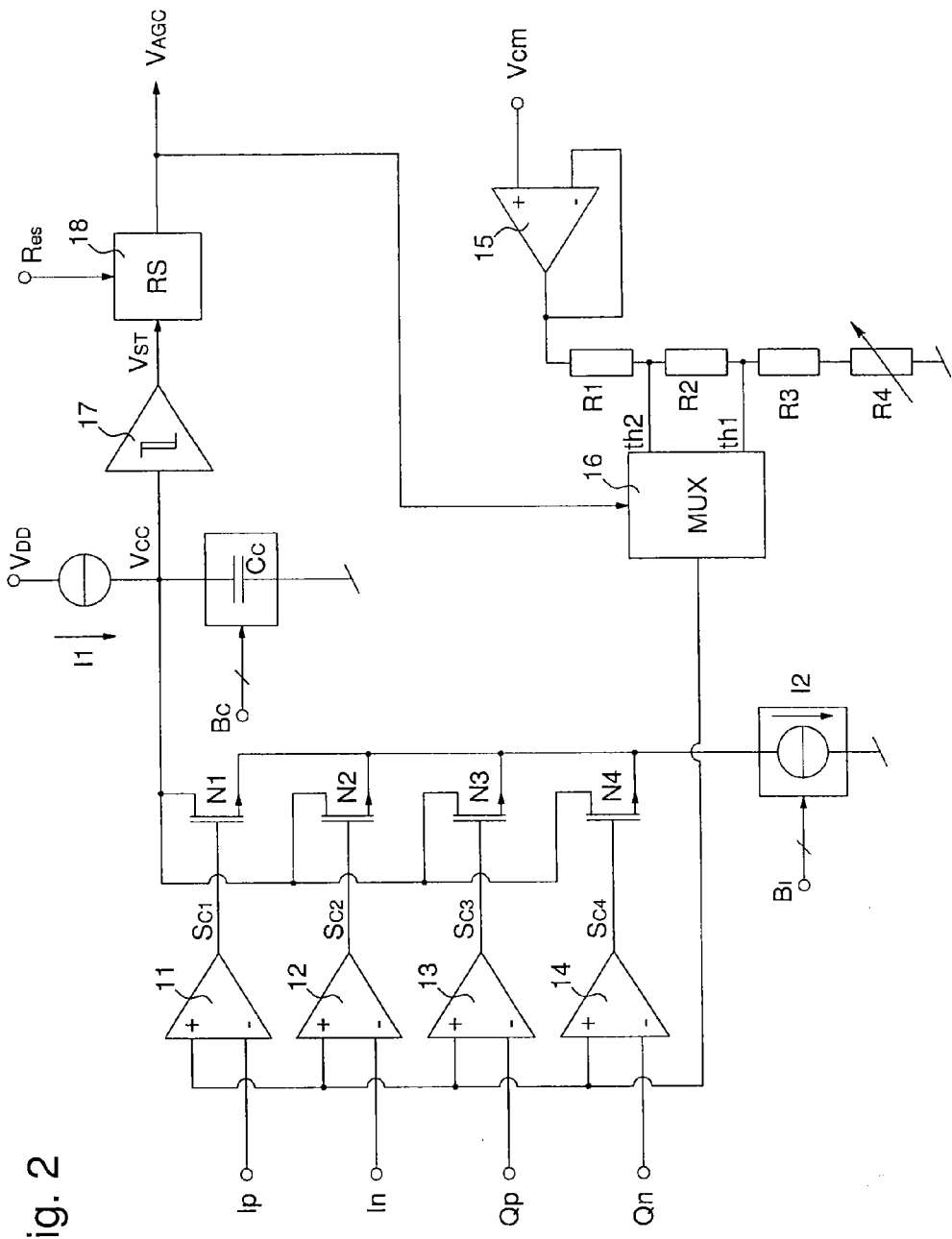
FIG. 2 shows the electronic components of an embodiment of the automatic gain control unit of the present invention.

FIG. 2 shows an embodiment of the automatic gain control unit for the low-power FSK radiofrequency signal receiver. In this embodiment, the automatic gain control unit includes at input four comparators 11, 12, 13, 14 to compare the four alternative intermediate signals Ip, In, Qp, Qn with at least a first reference threshold th1. Said first reference threshold th1 is defined for a comparison on an upper side or a lower side of the four alternative intermediate signals Ip, In, Qp, Qn. Said first reference threshold th1 is used to determine an amplitude level of the four alternative intermediate signals Ip, In, Qp, Qn, preferably to determine a high amplitude level. On FIG. 2, the determination of the amplitude level of the four alternative intermediate signals Ip, In, Qp, Qn is performed for example on the lower side. So said comparators 11, 12, 13, 14 can be considered like negative peak detectors.

It will be noted that the alternative intermediate signals Ip, In, Qp, Qn have generally a sinusoidal shape. The amplitude of said alternative intermediate signals Ip, In, Qp, Qn does not vary during a time period for receiving FSK radiofrequency signals given that data modulation is performed by frequency shift keying (FSK) or phase shift keying (PSK). The oscillation of alternative intermediate signals Ip, In, Qp, Qn is defined with respect to a common mode voltage $V_{cm}$ corresponding to the average voltage of the alternative intermediate signals. The common mode voltage $V_{cm}$ can be around 0 V, but generally at a voltage higher than 0 V, for example at an average voltage of 0.8 V, for a supply voltage $V_{DD}$ from a supply voltage source for example at 1.8 V. So the upper side of the alternative intermediate signals is a positive half cycle relative to the common mode voltage or average voltage, whereas the lower side of the alternative intermediate signals is a negative half cycle relative to the common mode voltage or average voltage.

In the embodiment on FIG. 2, the first reference threshold th1 is applied at the positive inputs of the first comparator 11, the second comparator 12, the third comparator 13 and the fourth comparator 14, in order to determine the high amplitude level of the alternative intermediate signals on the lower side. The first alternative intermediate signal, which is an in-phase positive intermediate signal Ip, is applied at the negative input of the first comparator 11. The second alternative intermediate signal, which is in-phase negative intermediate signal In, is applied at the negative input of the second comparator 12. The third alternative intermediate signal, which is a quarter-phase positive intermediate signal Qp, is applied at the negative input of the third comparator 13. Finally the fourth alternative intermediate signal, which is a quarter-phase negative intermediate signal Qn, is applied at the negative input of the fourth comparator 14.

The output of the first comparator 11 is connected to a gate of a first transistor N1 in order to control said first transistor N1 by a first control signal $S_{C1}$. The output of the second comparator 12 is connected to a gate of a second transistor N2 in order to control said second transistor N2 by a second control signal $S_{C2}$. The output of the third comparator 13 is connected to a gate of a third transistor N3 in order to control said third transistor N3 by a third control signal $S_{C3}$. Finally the output of the fourth comparator 14 is connected to a gate of the fourth transistor N4 in order to control said fourth transistor N4 by a fourth control signal $S_{C4}$.

Preferably, the first, second, third and fourth transistors N1, N2, N3, N4 are MOS transistors, and in the embodiment shown on FIG. 2, the first, second, third and fourth transistors N1, N2, N3, N4 are NMOS transistors. Said first, second, third and fourth transistors N1, N2, N3, N4 are successively conductive in time when the first, second, third and fourth alternative intermediate signals Ip, In, Qp. Qn are lower than the first reference threshold th1 for a comparison on the lower side. Said transistors N1, N2, N3, N4 are each conductive during a time period ΔT within each cycle period T of the sinusoidal intermediate signals Ip, In, Qp, Qn.

The first, second, third and fourth transistors N1, N2, N3, N4 are each connected in series with a second current source I2, which can be programmed by a binary word on 3 bits for example. Preferably the second current source I2 is connected to a low potential terminal of a supply voltage source for supplying a second current I2 by a source terminal of the first, second, third and fourth NMOS transistors N1, N2, N3, N4. A drain terminal of the first, second, third and fourth NMOS transistors N1, N2, N3, N4 are connected to a first terminal of a storage capacitor $C_C$, whereas the second terminal of the storage capacitor is connected to the low potential terminal of the supply voltage source. When each NMOS transistor N1, N2, N3, N4 is conductive, the second current I2 is used to discharge the storage capacitor $C_C$. The storage capacitor $C_C$ can be programmable by a binary word for example on 3 bits in order to adapt the capacitive value of the storage capacitor for defining a reactive time for charging or discharging said storage capacitor.

A first current source I1 of the automatic gain control unit is connected to a high potential terminal of the supply voltage $V_{DD}$ in order to supply a first constant current I1 on the storage capacitor $C_C$. Inversely of the second current I2, said first current I1 is used to charge said storage capacitor $C_C$. Given that the second current I2 is supplied for discharging the storage capacitor only when the first, second, third or fourth NMOS transistors N1, N2, N3, N4 are conductive, the value of the second current I2 has to be greater than the value of the first current I1. Preferably the second current source I2 can be programmed to be much greater than the first current source. For example the second current value I2 can be 5 times greater than the first current value I1. So the NMOS transistors N1, N2, N3, N4 can be conductive during 4 narrow pulses of control signals $S_{C1}$, $S_{C2}$, $S_{C3}$, $S_{C4}$ if the high amplitude level of the four sinusoidal intermediate signals is greater than a level defined by the first reference threshold th1. The widths of all the four pulses of control signals $S_{C1}$, $S_{C2}$, $S_{C3}$, $S_{C4}$ have to be greater than a value selected between 5% and 20% for example with respect to a cycle period T of the sinusoidal intermediate signals to discharge the storage capacitor $C_C$. Preferably it can be selected a value of 20%. The four pulse widths correspond to the time period $\Delta T$. This can be programmed also to set the AGC attack time.

The storage capacitor $C_C$ is connected at input of a bi-stable trigger element 17, which is a Schmitt-trigger element. The bi-stable trigger element 17 can provide an AGC output signal depending on the voltage level on the storage capacitor for tuning the gain of the LNA amplifier or of an IFA amplifier. If the amplitude level of the alternative intermediate signals is high by having the NMOS transistors N1, N2, N3, N4 conductive during a time period greater than 20% of the cycle period T, the voltage level $V_{CC}$ on the storage capacitor $C_C$ becomes low after having more discharged said storage capacitor $C_C$ by the second current I2, than charged by the first current I1. So the AGC output signal or level at output of the bi-stable trigger element 17 is high in order to attenuate the gain of the LNA amplifier or IFA amplifier by 12 dB for example. Otherwise if the NMOS transistors N1, N2, N3, N4 are conductive or not during a time period less than 20% of the cycle period T, the voltage level $V_{CC}$ on the storage capacitor $C_C$ is high by being charged only by the first current I1. In this case the AGC output signal or level at output of the bi-stable trigger element 17 is low in order to not attenuate the gain of the LNA amplifier or IFA amplifier.

It can be also provided for the automatic gain control unit to connect a RS latch 18 between the output of the bi-stable trigger element 17 and the output of said automatic gain control unit. Said RS latch 18 can be used to latch the output of the bi-stable trigger element 17 on the last edge in addition to allow various set modes and enables. Said RS latch can be reset by a signal Res in an initialisation mode or in a test mode.

The automatic gain control unit includes also a selecting means for providing the first reference threshold th1 or a second reference threshold th2 to the four comparators 11, 12, 13, 14. The first reference threshold th1 is defined to detect a high amplitude level of the four alternative intermediate signals Ip, In, Qp, Qn in order to attenuate the LNA or IFA amplifier gain. The second reference threshold th2 is defined to detect a low amplitude level of the four alternative intermediate signals Ip, In, Qp, Qn in order to increase or not attenuate the LNA or IFA amplifier gain. With the selecting means, it is possible to generate a hysteresis in the loop to select the first or second reference threshold to prevent chatter. In principle said hysteresis can generate a gain attenuation of the 12 dB plus 3.5 dB for example.

Figure 3:
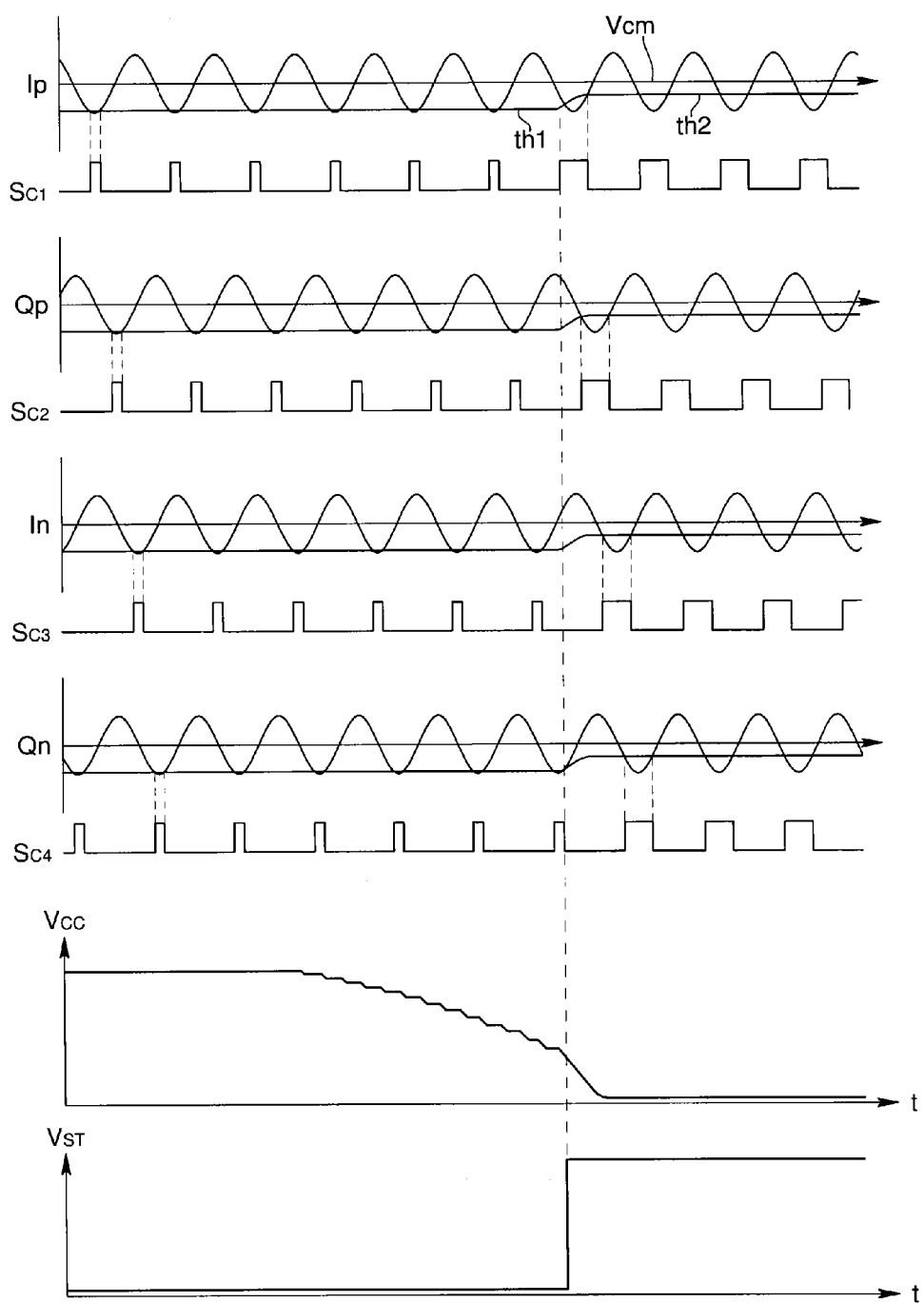
FIG. 3 shows a temporal diagram of signals through the automatic gain control unit of the present invention, for defining the detection of a high amplitude level of alternative intermediate signals and for attenuating the gain of an amplifier of the receiver or transceiver.
Figure 4:
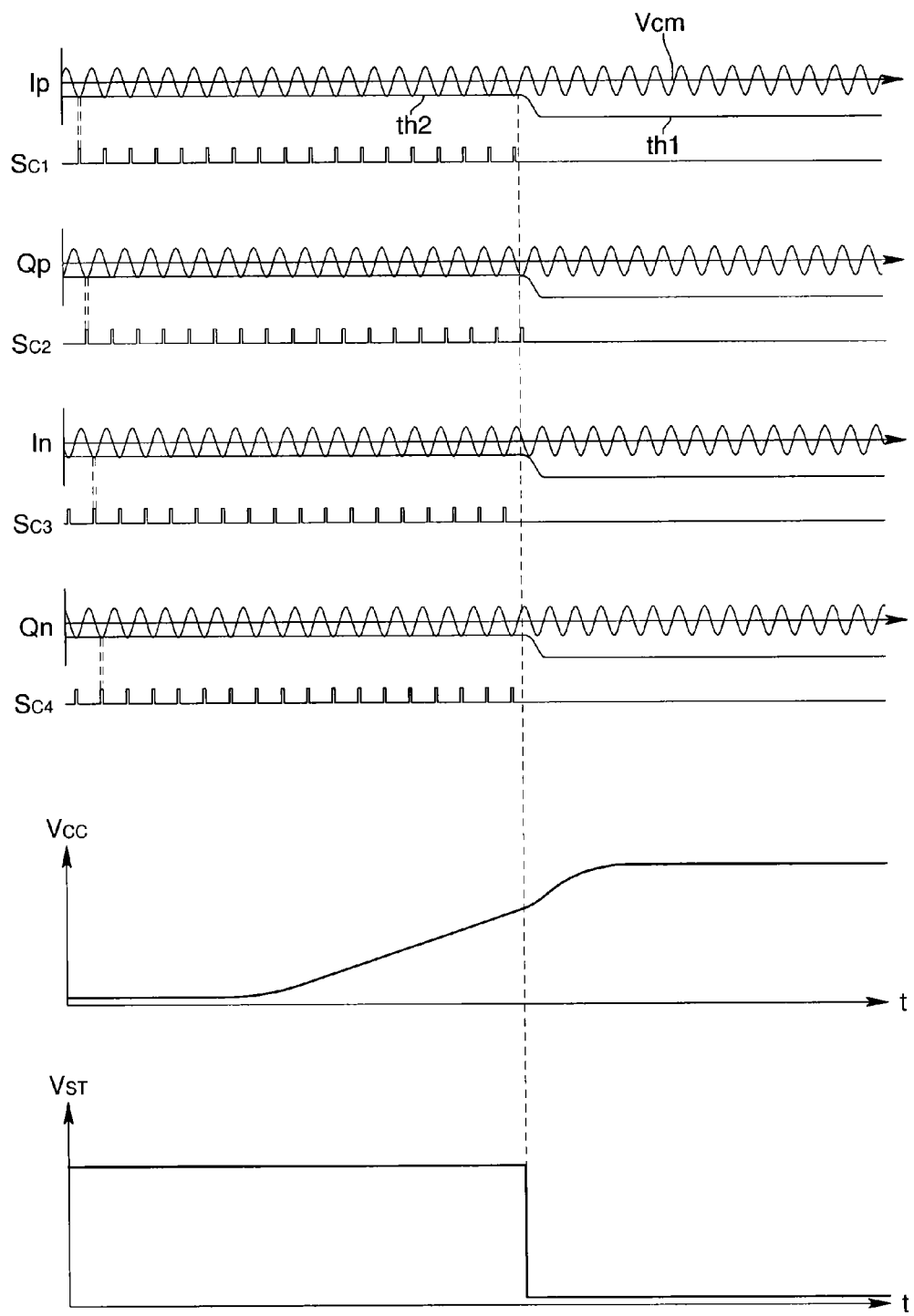
FIG. 4 shows a temporal diagram of signals through the automatic gain control unit of the present invention, for defining the detection of a low amplitude level of alternative intermediate signals and in order to not attenuate the gain of an amplifier of the receiver or transceiver.

It is to be noted as shown on FIGS. 3 and 4 explained hereafter, that the attenuation after having controlled the high amplitude level with the first reference threshold th1 will remain set until the input signals drop the 3.5 dB at which time the attenuation will be released. In the opposite case of where the attenuation is being released, the attenuation threshold will drop down by 15.5 dB to the original level and remain there until the signal amplitude is great enough to trip the four comparators again.

The selection means includes a voltage follower 15, which receives a common mode voltage $V_{cm}$ corresponding to the average voltage of the alternative intermediate signals Ip, In, Qp, Qn, a resistor divider connected between the output of the voltage follower 15 and the low potential terminal of the supply voltage source. The resistor divider is composed of at least a first resistor R1, a second resistor R2 and a third resistor R3 in series connected, with the first resistor R1 linked to the output of the voltage follower 15. A first connection node between the first and second resistors R1 and R2 defines the second reference threshold th2, and a second connection node between the second and third resistors R2 and R3 defines the first reference threshold th1. The first and second connection nodes th1, th2 are each connected respectively to one of two inputs of a multiplexer 16. Said multiplexer 16 is controlled by the AGC output signal $V_{AGC}$ of the automatic gain control unit to select the first or second reference thresholds.

The resistor divider can include a fourth resistor R4 between the third resistor R3 and the low potential terminal of the supply voltage source. Said fourth resistor R4 can be adaptable by a binary word on 2 bits to tune the first and second reference thresholds th1 and th2.

In order to generate a hysteresis of 3.5 dB with the selecting means, the first resistor value R1 can be defined by R/6, where R is a value of a base resistor. In this case, it is possible to connect in parallel 6 resistors with the resistor value R. The second resistor value can be defined by 5·R/6, with 5 times an array of 6 resistors in parallel with the resistor value R. Finally, the third resistor value R is defined by 5·R with 5 resistors in series with the resistor value R. The fourth resistor R4 can be adaptable by 2-bit word to have a value between 0 and 4.5·R. With these resistor values, the threshold level is set by the resistor divided and is either "1" or "1/6", where the ratio 1/6 provided the 15.5 dB (20·log(1/6)) delta between setting and clearing the attenuation at output of the RS latch 18.

Thanks the selecting means, when the automatic gain control unit supplies an AGC output signal $V_{AGC}$ to attenuate the amplifier gain, the second reference threshold th2 is selected by the multiplexer 16, and when the automatic gain control unit supplies an AGC output signal $V_{AGC}$ to not attenuate the amplifier gain, the first reference threshold th1 is selected. A commutation from the first reference threshold th1 to the second reference threshold th2 is performed when the first current value I1 becomes lower than the second current value I2 multiplied by $\Delta T/T$. $\Delta T$ corresponds to the time period where the second current I2 is supplied to the storage capacitor, and T corresponds to a cycle period of the alternative intermediate signals. A commutation from the second reference threshold th2 to the first reference threshold th1 is performed when the first current value I1 becomes higher than I2·(ΔT/T). In this case, the low amplitude level of the four alternative intermediate signals is detected by the comparators 11, 12, 13, 14.

FIG. 3 shows a temporal diagram of the different signals through the automatic gain control unit for defining the detection of a high amplitude level of alternative intermediate signals Ip, Qp, In, Qn and for attenuating the gain of an amplifier of the receiver. The stored voltage $V_{CC}$ on the storage capacitor begins at a high level for example at 1.8 V, whereas the output signal $V_{ST}$ of the bi-stable trigger element is at a low level for example at 0 V. The amplitude level of the four alternative intermediate signals Ip, Qp, In, Qn is shown too high and lower than the first reference threshold th1 on the lower side. The first reference threshold th1 can be for example at 0.72 V. The peak to peak voltage level of the alternative intermediate signals Ip, Qp, In, Qn can be for example slightly less than 200 mV centred on the common mode voltage $V_{cm}$ at 0.8 V.

As the voltage level in the negative half cycle of each alternative intermediate signal is close to 0.7 V in this example, each NMOS transistor is conductive during the width of the respective pulse of the control signal $S_{C1}$, $S_{C2}$, $S_{C3}$, $S_{C4}$. The second current I2 multiplied by ΔT/T becomes greater than the first current value I1. So the voltage level $V_{CC}$ on the storage capacitor progressively decreases from the high level at 1.8 V to a low level at 0 V, that can be programmable to set the AGC attack time. When the voltage $V_{CC}$ on the storage capacitor drops below 0.5 V, the output voltage $V_{ST}$ from the bi-stable trigger element commutes from the low voltage level to a high voltage level at 1.8 V to attenuate the gain of the amplifier by 12 dB. The commutation from the low level to the high level at the output of the bi-stable trigger element controls the multiplexer of the selecting means in order to provide the second reference threshold th2 after the first reference threshold th1. So said second reference threshold th2 will be maintained until the amplitude level of the alternative intermediate signals drops under the second reference threshold th2, which can be approximately at 0.79 V, which defines the hysteresis by 3.5 dB to prevent chatter.

FIG. 4 shows a temporal diagram of signals through the automatic gain control unit for defining the detection of a low amplitude level of alternative intermediate signals Ip, Qp, In, Qn and in order to not attenuate the gain of an amplifier of the receiver. The stored voltage $V_{CC}$ on the storage capacitor begins at a low level for example at 0 V, whereas the output signal $V_{ST}$ of the bi-stable trigger element is at a high level for example at 1.8 V for attenuating the gain of the amplifier. The amplitude level of the four alternative intermediate signals Ip, Qp, In, Qn is shown too low and approximately at the level of the second reference threshold th2 selected on the lower side. The second reference threshold th2 can be for example at 0.79 V. The peak to peak voltage level of the alternative intermediate signals Ip, Qp, In, Qn can be for example at 20 mv or slightly less than 20 mV centred on the common mode voltage $V_{cm}$ at 0.8 V.

As the voltage level in the negative half cycle of each low alternative intermediate signal is close to 0.79 V in this example, each NMOS transistor is conductive during a small width of the respective pulse of the control signal $S_{C1}$, $S_{C2}$, $S_{C3}$, $S_{C4}$. The second current I2 multiplied by ΔT/T becomes smaller than the first current value I1. So the voltage level $V_{CC}$ on the storage capacitor progressively increases from the low level at 0 V to a high level at 1.8 V, that can be programmable to set the AGC decay time. When the voltage $V_{CC}$ on the storage capacitor increase above 1.1 V for example, the output voltage $V_{ST}$ from the bi-stable trigger element commutes from the high voltage level at 1.8 V to a low voltage level at 0 V to not attenuate the gain of the amplifier. The commutation from the high level to the low level at the output of the bi-stable trigger element controls the multiplexer of the selecting means in order to provide the first reference threshold th1 after the second reference threshold th2. So said first reference threshold th1 will be maintained until the amplitude level of the alternative intermediate signals increases to be under the first reference threshold th1, which can be approximately at 0.72 V.

It will be noted that the automatic gain control unit can be also conceived with only one comparator 11 to compare a first alternative intermediate signal Ip with the first reference threshold th1 or the second reference threshold th2. In this case with high amplitude level of the first alternative intermediate signal Ip lower than the first reference threshold th1 on the lower side, the second current I2 multiplied by ΔT/T has to be greater than the first current I1 for controlling an attenuation of the amplifier. The automatic gain control unit can be also conceived with two comparators to compare an in-phase intermediate signal and a quarter-phase intermediate signal with the first reference threshold th1 or the second reference threshold th2.

The first reference threshold th1 or the second reference threshold th2 from the selecting means can be defined for a comparison on an upper side of one alternative intermediate signal or two alternative intermediate signals, or the four alternative intermediate signals Ip, In, Qp, Qn. In this case, the resistor divider can be connected between the output of the voltage follower and the high potential terminal of the supply voltage source. The first reference threshold th1 or the second reference threshold th2 are connected at negative input of each comparator, whereas each alternative intermediate signal is connected at positive input of each comparator, if a NMOS transistor is always used at output of each comparator.

It can also be envisaged to compare an alternative intermediate signal with a first reference threshold defined on the lower side through a first comparator, and with a first complementary reference threshold defined on the upper side through a second comparator. In this case each transistor at output of the first and second comparators are controlled in each positive and negative half cycle of the alternative intermediate signal.

If one or two or four comparators are used to compare the alternative intermediate signals with the first reference threshold or the second reference threshold on the lower side or the upper side, it can be envisaged to connect a PMOS transistor at output of each comparator. However the first reference threshold or the second reference threshold are received at negative input of each comparator for a comparison on the lower side and at positive input of each comparator for a comparison on the upper side inversely from the case with a NMOS transistor.

Finally it can be envisaged also to connect the second current source at the high potential terminal of the supply voltage source, whereas the first current source can be connected at the low potential terminal of the supply voltage source. In this case, when each transistor at output of the comparators is controlled for being conductive, the second current can charge the storage capacitor, whereas the first current is used to discharge said storage capacitor.

On the basis of the description just given, numerous variants of the automatic gain control unit for a low power receiver or transceiver can be designed by a person skilled in the art without departing from the scope of the invention as defined in the claims. The AGC output signal can be directly supplied at the output of the bi-stable trigger element.

What is claimed is:

1. An automatic gain control unit for a low power receiver or transceiver, said receiver or transceiver comprising:
   at least one antenna for receiving radio frequency signals,
   at least one low noise amplifier for amplifying the signals received by the antenna,
   a local oscillator for supplying oscillating signals,
   at least one mixer unit for mixing the amplified incoming signals with the oscillating signals supplied by the local oscillator, in order to produce alternative intermediate signals,
   wherein the automatic gain control unit includes:
      a first current source for charging or discharging by a first current at least one storage capacitor,
      at least one comparator for comparing at least a first alternative intermediate signal among the alternative intermediate signals and a first reference threshold, which is defined for a comparison with an upper side or a lower side of the first alternative intermediate signal to determine an amplitude level of the first alternative intermediate signal,
      a gate controlled transistor by an output of the comparator, the transistor being conductive when the first alternative intermediate signal is greater than the first reference threshold for a comparison on the upper side, or lower than the first reference threshold for a comparison on the lower side, the transistor being connected in series between a second current source and the storage capacitor in order to discharge or charge by a second current the storage capacitor inversely to the first current, the second current being supplied to the storage capacitor when the transistor is conductive, and the second current having a value greater than the first current, and
      a bi-stable trigger element connected to the storage capacitor and to provide an AGC signal depending on the voltage level on the storage capacitor for tuning the gain of the low noise amplifier or of a mixer unit amplifier.

2. The automatic gain control unit according to claim 1, wherein the control unit includes a first comparator and a second comparator, the first comparator being able to compare the first reference threshold and the first alternative intermediate signal, which is an in-phase intermediate signal, on the upper side or the lower side, and the second comparator being able to compare the first reference threshold and a second alternative intermediate signal, which is a quarter-phase intermediate signal, on the upper side or the lower side, wherein the control unit includes a first gate controlled transistor by an output of the first comparator and a second gate controlled transistor by an output of the second comparator, the first and second transistors being connected in series between the second current source and the storage capacitor, and wherein the second current being supplied to the storage capacitor when the first transistor and/or the second transistor are conductive.

3. The automatic gain control unit according to claim 1, wherein the control unit includes a first comparator, a second comparator, a third comparator and a fourth comparator, wherein the first comparator is able to compare the first reference threshold and the first alternative intermediate signal, which is an in-phase positive intermediate signal, on the upper side or the lower side, wherein the second comparator is able to compare the first reference threshold and a second alternative intermediate signal, which is an in-phase negative intermediate signal, on the upper side or the lower side, wherein the third comparator is able to compare the first reference threshold and a third alternative intermediate signal, which is a quarter-phase positive intermediate signal, on the upper side or the lower side, wherein the fourth comparator is able to compare the first reference threshold and a fourth alternative intermediate signal, which is a quarter-phase negative intermediate signal, on the upper side or the lower side, wherein the control unit includes a first gate controlled transistor by an output of the first comparator, a second gate controlled transistor by an output of the second comparator, a third gate controlled transistor by an output of the third comparator, a fourth gate controlled transistor by an output of the fourth comparator, the first, second, third and fourth transistors being connected in series between the second current source and the storage capacitor, and wherein the second current being supplied to the storage capacitor when the first transistor and/or the second transistor and/or the third transistor and/or the fourth transistor are conductive.

4. The automatic gain control unit according to claim 1, wherein the second current source is programmable by a binary word in order to adapt the value between a minimum second current value greater than the first current value and a maximum second current value.

5. The automatic gain control unit according to claim 1, wherein the storage capacitor is programmable by a binary word in order to adapt the capacitive value of the storage capacitor.

6. The automatic gain control unit according to claim 1, for which the antenna of the receiver can receive FSK or PSK radio frequency signals, wherein the control unit includes a selecting means for providing the first reference threshold or a second reference threshold to the comparator, the first reference threshold being defined to detect a high amplitude level of at least the first alternative intermediate signal in order to attenuate the amplifier gain, whereas the second reference threshold is defined to detect a low amplitude level of at least the first alternative intermediate signal in order to increase the amplifier gain, wherein when the control unit supplies an AGC signal to attenuate the amplifier gain, the second reference threshold is selected, and wherein when the control unit supplies an AGC signal to increase the amplifier gain, the first reference threshold is selected.

7. The automatic gain control unit according to claim 6, wherein at least the comparator is provided to compare at least the first alternative intermediate signal, which has a sinusoidal shape, with the first reference threshold or the second reference threshold, wherein a commutation from the first reference threshold to the second reference threshold is performed when the first current value I1 becomes lower than the second current value I2 multiplied by $\Delta T/T$, with $\Delta T$ corresponding to the time period where the second current is supplied to the storage capacitor, and T corresponding to a cycle period of the first alternative intermediate signal, and wherein a commutation from the second reference threshold to the first reference threshold is performed when the first current value I1 becomes higher than $I2 \cdot (\Delta T/T)$.

8. The automatic gain control unit according to claim 7, wherein the second current value I2 is determined to be 5 times greater than the first current value I1.

9. The automatic gain control unit according to claim 6, wherein the selecting means includes a voltage follower, which receives a common mode voltage corresponding to the average voltage of the alternative intermediate signals, a resistor divider connected between the output of the voltage follower and one terminal of a supply voltage source, said resistor divider being composed of at least a first resistor, a second resistor and a third resistor in series connected, with the first resistor linked to the output of the voltage follower, wherein a first connection node between the first and second resistors defines the second reference threshold, wherein a second connection node between the second and third resistors defines the first reference threshold, and wherein the first and second connection nodes are each connected respectively to one of two inputs of a multiplexer, which is controlled by an AGC output signal of the control unit to select the first or second reference thresholds.

10. The automatic gain control unit according to claim 9, wherein the resistor divider includes a fourth resistor between the third resistor and the terminal of the supply voltage source, said fourth resistor being adaptable by a binary word to tune the first and second reference thresholds.

11. The automatic gain control unit according to claim 9, wherein the first resistor value is defined by R/6, where R is a value of a base resistor, wherein the second resistor value is defined by 5·R/6, and wherein the third resistor value is defined by 5·R.

12. The automatic gain control unit according to claim 11, wherein the resistor divider includes a fourth resistor between the third resistor and the terminal of the supply voltage source, said fourth resistor being adaptable by a binary word to have a value between 0 and 4.5·R.

13. The automatic gain control unit according to claim 1, wherein the bi-stable trigger element is linked to a latch, which supplies the AGC signal for tuning the amplifier gain.

14. The automatic gain control unit according to claim 10, wherein the fourth resistor is connected to a low potential terminal of a supply voltage source, wherein the first reference threshold is lower than the second reference threshold, and wherein the comparator receives on a positive input the first reference threshold or the second reference threshold and on a negative input at least the first alternative intermediate signal to be compared on the lower side with the first reference threshold or the second reference threshold.

15. The automatic gain control unit according to claim 10, wherein the transistor connected at output of the comparator is a MOS transistor.

16. The automatic gain control unit according to claim 15, wherein the transistor connected at output of the comparator is a NMOS transistor, and wherein the second current source is connected to the low potential terminal of the supply voltage, whereas the first current is connected to a high potential terminal of the supply voltage source, wherein the first current is intended to charge the storage capacitor, whereas the second current is intended to discharge the storage capacitor.

* * * * *